United States Patent
Yao et al.

[11] Patent Number: 5,943,599
[45] Date of Patent: Aug. 24, 1999

[54] METHOD OF FABRICATING A PASSIVATION LAYER FOR INTEGRATED CIRCUITS

[75] Inventors: Liang-Gi Yao; Yeur-Luen Tu, both of Taipei; Sen-Huan Huang, Tainan; Kwong-Jr Tsai, Kaohsiung; Meng-Jaw Cherng, Hsinchu, all of Taiwan

[73] Assignee: Vanguard International Semiconductor Corporation, Hsinchu, Taiwan

[21] Appl. No.: 08/920,133

[22] Filed: Aug. 27, 1997

[51] Int. Cl.$^6$ .................................................. H01L 21/4763
[52] U.S. Cl. ............................ 438/623; 438/624; 438/763; 438/778; 438/786; 438/787; 438/791; 438/958
[58] Field of Search .................................. 438/623, 624, 438/763, 778, 786, 787, 791, 958

[56] References Cited

U.S. PATENT DOCUMENTS 5,668,398  9/1997  Havemann et al. ........................ 257/522
5,795,821  8/1998  Bacchetta et al. ........................ 438/624
5,849,632  12/1998  Tuttle et al. ............................ 438/633

Primary Examiner—John F. Niebling
Assistant Examiner—David A. Zarneke
Attorney, Agent, or Firm—Christensen O'Connor Johnson & Kindness, PLLC

[57] ABSTRACT

A metal layer (24) is formed on an isolation layer (22) to act as interconnections. Subsequently, a thin liner layer (26) is optionally formed along the surface of the metal layer (24) to serve as a buffer layer. An undoped silicate glass (USG) layer (28) is deposited on the liner layer (26). The USG layer (28) is formed using ozone and tetraethylorthosilicate (TEOS) as a source at a temperature of approximately 380 to 420° C. Oxygen gas is used as a carrier for the ozone. The flow rate of the oxygen gas is approximately 4000 to 6000 sccm. Helium gas is used as a carrier for the TEOS. The flow rate of the helium is approximately 3000 to 5000 sccm. A silicon nitride layer (30) is deposited on the USG layer (28) using plasma enhanced chemical vapor deposition (PECVD). The silicon nitride layer (30) serves as a main passivation layer. The thickness of the silicon nitride layer (30) is approximately 3000 to 7000 angstroms.

12 Claims, 3 Drawing Sheets

METHOD OF FABRICATING A PASSIVATION LAYER FOR INTEGRATED CIRCUITS

FIELD OF THE INVENTION

The present invention relates to a semiconductor press, and more specifically, to a method of forming a passivation layer for semiconductor devices.

BACKGROUND OF THE INVENTION

The advent of Ultra Large Scale Integration (ULSI) circuit technologies has concurrently prompted reductions in the dimensions of semiconductor devices. To accommodate ULSI applications, the size of various devices, including memory cells, as well as the area available therefor on integrated circuits, has been significantly decreased. In particular, the area for forming a dynamic random access memory cell has been reduced to dimensions in the submicron range, thus achieving higher chip density. The dimensions of semiconductor devices will continue to decrease.

Integrated circuit fabrication involves the formation of semiconductor devices, isolation structure, electrical connection and passivation. Passivation is typically used, among other purposes, to prevent moisture from penetrating into underlying layers of semiconductor devices. Conventional passivation techniques involve forming a protective layer over semiconductor devices. One such layer used to perform passivation is a silicon oxide/silicon nitride composition (oxide/nitride) layer. The oxide/nitride layer is typically deposited by plasma enhanced chemical vapor deposition (PECVD).

The reduction in semiconductor devices has created problems in passivation. More specifically, as device dimensions are reduced, so are spacings between metal lines. The reduction in spacing between metal lines in turn complicates and, in some circumstances, altogether prevents effective passivation. FIGS. 1 and 2 illustrate a semiconductor substrate 2 having an isolation layer 4. An oxide/nitride layer 8 is formed on a metal layer 6. The oxide/nitride layer 8 is intended to function as a passivation layer.

However, as shown in FIG. 1, the close proximity between metal regions, i.e., density, of the metal layer 6 undesirably causes the formation of key holes 10 in the oxide/nitride layer 8. The presence of key holes 10 traps photoresist and results in the blowout of photoresist during photoresist stripping. These consequences associated with the presence of key holes 10 cause bond pad corrosion and also degrade reliability.

The PECVD oxide/nitride layer used in conventional passivation techniques have other disadvantages. One significant disadvantage is poor step coverage, as shown in FIG. 2. It will be appreciated that poor step coverage causes failures in pin hole testing and pressure cook testing.

What is required is a new and improved passivation process to overcome the aforementioned disadvantages associated with conventional passivation techniques.

SUMMARY OF THE INVENTION

In accordance with the invention, an isolation layer is formed on a semiconductor substrate. A metal layer is subsequently formed on the isolation layer to act as interconnections. The metal layer can be, for example, aluminum, copper, tungsten, or titanium. An undoped silicate glass (USG) layer is formed by sub atmospheric chemical vapor deposition (SACVD) using ozone and tetraethylorthosilicate (TEOS) as sources at a temperature in an approximate range between 380 to 420° C. Oxygen gas serves as a carrier gas for the ozone. The flow rate of the oxygen gas approximately ranges from 4000 to 6000 sccm. Helium gas serves as a carrier gas for the TEOS. The flow rate of the helium gas approximately ranges from 3000 to 5000 sccm. The rate of the TEOS is approximately 250 to 350 mg/min and, in the preferred embodiment, is approximately 320 mg/min. A silicon nitride layer is deposited on the USG layer using plasma enhanced chemical vapor deposition (PECVD) to serve as a main passivation layer. The thickness of the silicon nitride layer is approximately 3000 to 7000 angstroms. The silicon nitride layer is formed at a temperature range of approximately range of 300–450° C. The reactive gases used to form the silicon nitride layer are $SiH_4$, $NH_3$, $N_2$, $N_2O$ or $SiH_2Cl_2$, $NH_3$, $N_2$, $N_2O$.

In accordance with other aspects of this invention, a thin liner layer composed of silicon oxide or PECVD oxysilicon nitride is optionally formed. The liner layer is formed on the surface of the metal layer before forming the USG layer. The liner layer serves as a buffer for reducing stress and hot carriers between the metal layer and other layers.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention is a method of making a passivation layer for integrated circuits. As will be discussed below, this method can be used to increase the performance of the passivation layer. A detailed discussion of the method now follows.

Figure 1:
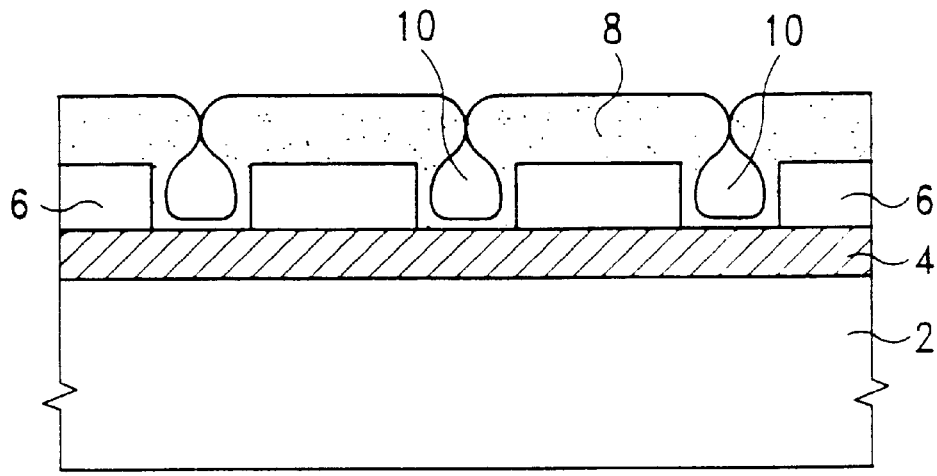
FIG. 1 is a cross sectional view of a semiconductor wafer illustrating the formation of a passivation layer with key holes adjacent a dense metal region in accordance with the prior art.
Figure 2:
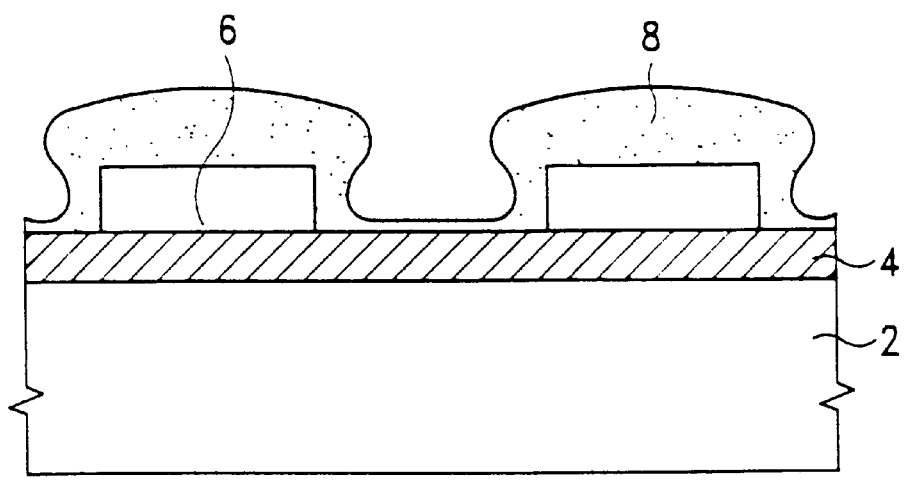
FIG. 2 is a cross sectional view of a semiconductor wafer illustrating the formation of a passivation layer with poor step coverage adjacent an isolated metal region in accordance with the prior art.
Figure 3:
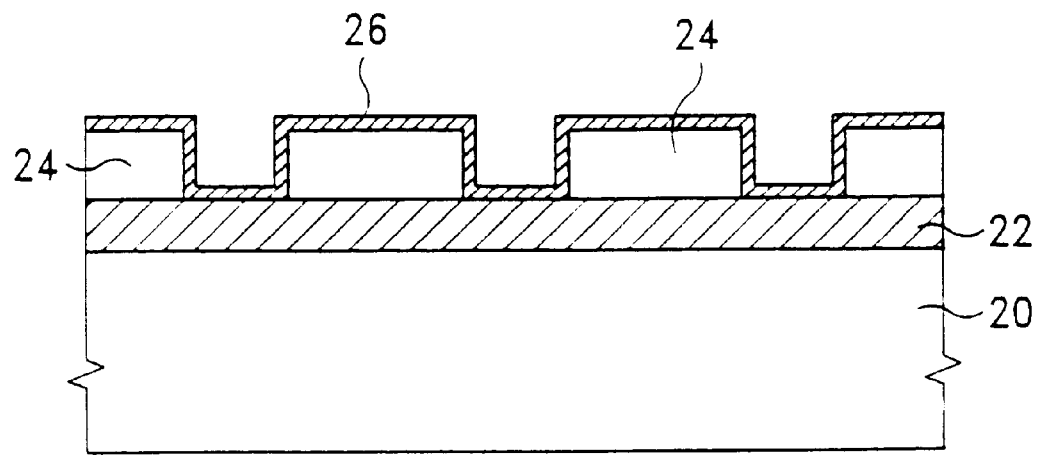
FIG. 3 is a cross sectional view of a semiconductor wafer illustrating the step of forming a dense metal layer and a liner layer in accordance with the present invention.

Referring to FIG. 3, a single crystal P-type substrate 20 with a <100> crystallographic orientation is used in the preferred embodiment of the present invention. An isolation layer 22 is formed to isolate semiconductor devices from one another in an integrated circuit. Because many of the steps briefly discussed above and below, such as forming isolation layers, are readily appreciated by those skilled in the art of integrated circuit fabrication, they are not discussed in detail. Rather, only a cursory description of such steps are provided. However, all novel and inventive features of the present invention are discussed in detail.

After the formation of the isolation layer 22, a metal layer 24 is formed on the isolation layer 22 to serve as interconnections. The metal layer 24 can be, for example, aluminum, copper, tungsten, titanium or other metal having suitable characteristics. Conventional lithography technology and etching technology are used to generate a pattern for the metal layer 24.

A thin liner layer 26 composed of silicon oxide or PECVD oxysilicon nitride is optionally formed along the surface of the metal layer 24. The thin liner layer 26 has a thickness less than approximately 1000 angstroms. The purpose of forming the liner layer 26 is to serve as a buffer for reducing stress and hot carriers between the metal layer 24 and subsequent layers.

Figure 4:
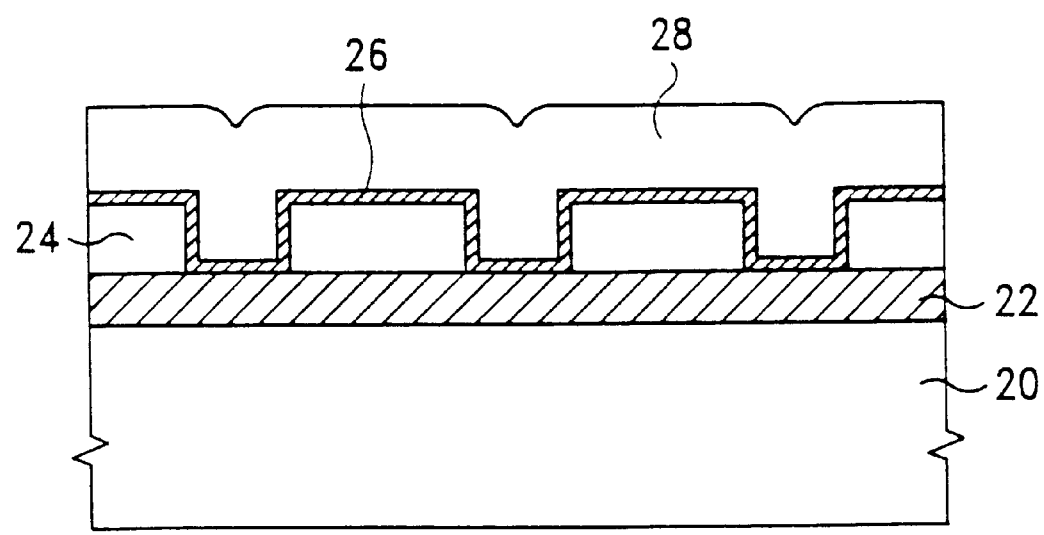
FIG. 4 is a cross sectional view of a semiconductor wafer illustrating the step of forming an undoped silicate glass layer on a liner layer in accordance with the present invention.

Turning to FIG. 4, an undoped silicate glass (USG) layer 28 is deposited on the liner layer 26. The USG layer 28 has a thickness of approximately 1000 to 6000 angstroms. In the preferred embodiment, the USG layer 28 is formed by sub atmospheric chemical vapor deposition (SACVD) using ozone and tetraethylorthosilicate (TEOS) as sources at a temperature range of approximately 380 to 420° C. Atmospheric chemical vapor deposition (AMCVD) can be also used for forming the USG layer 28. Oxygen gas serves as a carrier gas of the ozone. The flow rate of the oxygen gas is approximately 4000 to 6000 sccm. Helium gas serves as a carrier gas for the TEOS. The flow rate of the helium gas is approximately 3000 to 5000 sccm. The flow rate of the TEOS is approximately 250 to 350 mg/min. Preferably, however, the flow rate of the TEOS is approximately 320 mg/min. The ozone-TEOS undoped silicate glass (USG) exhibits a flow-like behavior and has good gap filling capability. These characteristics of the USG layer 28 prevent the formation of key holes between metal lines at pitch limited areas.

Figure 5:
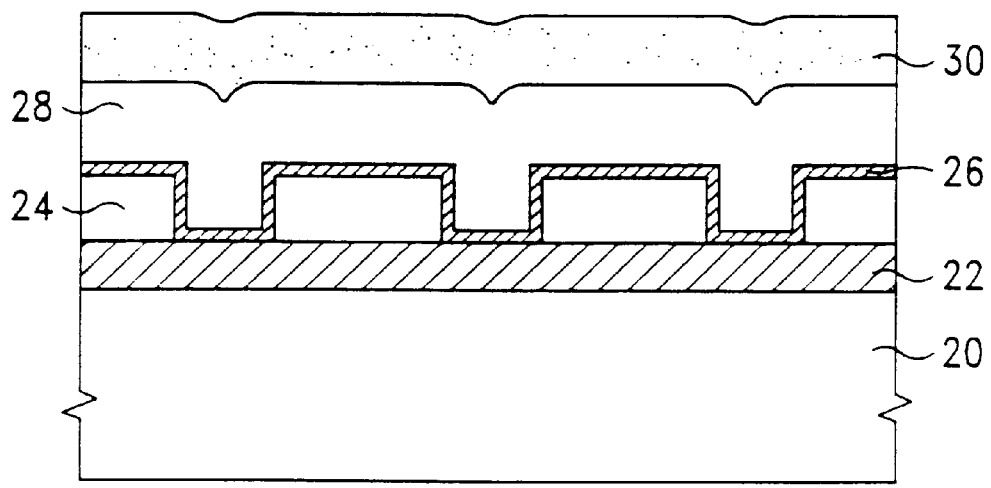
FIG. 5 is a cross sectional view of a semiconductor wafer illustrating the step of forming a silicon nitride layer on the undoped silicate glass layer adjacent a dense metal layer in accordance with the present invention.

As shown in FIG. 5, a silicon nitride layer 30 is deposited on the USG layer 28 using plasma enhanced chemical vapor deposition (PECVD). The silicon nitride layer 30 serves as a main passivation layer. The thickness of the silicon nitride layer 30 is approximately 3000 to 7000 angstroms. The temperature to form the silicon nitride layer 30 is approximately 350–450° C. In the preferred embodiment, the reactant gases forming the silicon nitride layer 30 are $SiH_4$, $NH_3$, $N_2$, $N_2O$ or $SiH_2Cl_2$, $NH_3$, $N_2$, $N_2O$.

The passivation method of the present invention provides many significant advantages over conventional techniques. For example, the silicon nitride layer 30 can prevent the penetration of moisture and alkaline ions, such as sodium and potassium. As another example, the USG layer 28 in accordance with the present invention overcomes the step coverage problems associated with conventional PECVD silicon nitride layers used in passivation. As yet another example, the passivation method of the present invention can prevent the presence of weak points at side-walls, which may be the origin for pin holes. Experimental results have indicated that the USG layer 28 and the silicon nitride layer 30 in accordance with the present invention can easily pass pin hole testing.

Figure 6:
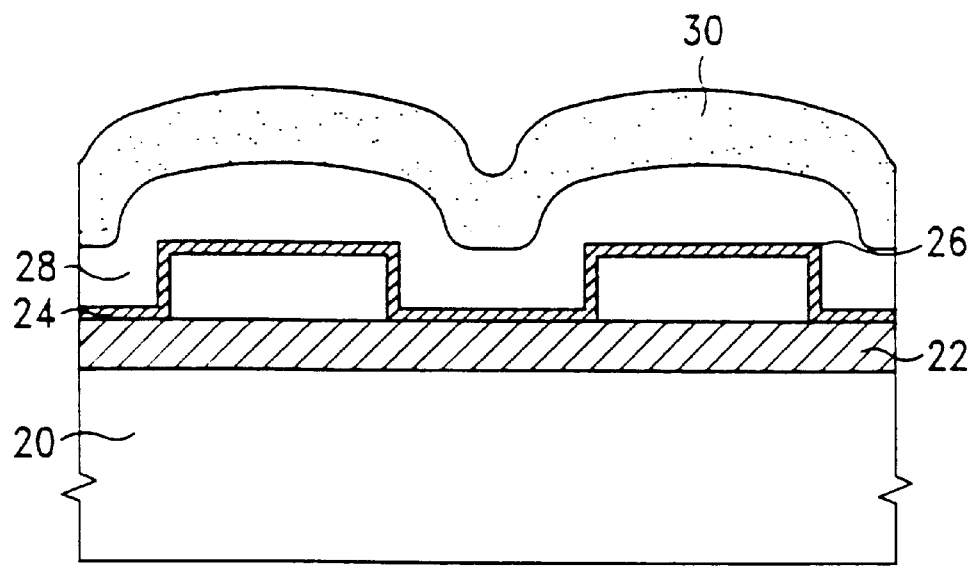
FIG. 6 is a cross sectional view of a semiconductor wafer illustrating step coverage provided in accordance with the passivation method of the present invention.

FIG. 6 illustrates the result of the present invention when the USG layer 28 and the silicon nitride layer 30 are formed over the substrate 20 at an isolated metal region of the metal layer 24. It will be readily appreciated that the passivation layer formed in accordance with the present invention provides optimal step coverage.

As is understood by a person skilled in the art, the foregoing description of the preferred embodiment of the present invention is illustrative of the present invention rather than a limitation thereon. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method for manufacturing a passivation layer for an integrated circuit having a metal pattern formed over the integrated circuit, the method comprising the steps of:

forming a liner layer composed of silicon oxide on said metal pattern;

forming an undoped silicate glass (USG) layer, having a thickness between 1000–6000 Å, over said liner layer to prevent the formation of key holes between said metal pattern at pitch limited areas, wherein said liner layer serves as a buffer for reducing the stress between said metal pattern and said USG layer; and forming a silicon nitride layer using plasma enhanced chemical vapor deposition on said undoped silicate glass layer to serve as a main passivation layer.

2. The method of claim 1, wherein said liner layer is formed to have a thickness less than approximately 1000 angstroms.

3. The method of claim 1, wherein said step of forming an undoped silicate glass layer comprises the substep of using sub atmospheric chemical vapor deposition.

4. The method of claim 1, wherein said step of forming an undoped silicate glass layer comprises the substep of using atmospheric chemical vapor deposition.

5. The method of claim 1, wherein said undoped silicate glass layer is formed at a temperature of approximately 380 to 420° C.

6. The method of claim 1, further comprising the step of providing ozone and tetraethylorthosilicate (TEOS) as a reactant source for said undoped silicate glass layer.

7. The method of claim 6, further comprising the step of providing oxygen gas as a carrier gas for said ozone, said oxygen gas having a flow rate of approximately 4000 to 6000 sccm.

8. The method of claim 6, further comprising the step of providing helium gas as a carrier gas for said TEOS, said helium gas having a flow rate of approximately 3000 to 5000 sccm.

9. The method of claim 1, further comprising the step of providing $SiH_4$, $NH_3$, $N_2$, $N_2O$ as reactant gases for forming said silicon nitride layer.

10. The method of claim 1, further comprising the step of providing $SiH_2Cl_2$, $NH_3$, $N_2$, $N_2O$ as reactant gases for forming said silicon nitride layer.

11. The method of claim 1, wherein said silicon nitride layer is formed at a temperature of approximately 350 to 450° C.

12. The method of claim 1, wherein said silicon nitride layer is formed to have a thickness of approximately 3000 to 7000 angstroms.

* * * * *